United States Patent
Conti et al.

(10) Patent No.: US 11,271,042 B2
(45) Date of Patent: Mar. 8, 2022

(54) VIA RESISTANCE REDUCTION

(71) Applicant: INTEL CORPORATION, Santa Clara, CA (US)

(72) Inventors: Anna Maria Conti, Agrate Brianza (IT); Cristina Casellato, Sulbiate (IT); Andrea Redaelli, Casatenovo (IT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/958,654

(22) PCT Filed: Mar. 16, 2018

(86) PCT No.: PCT/US2018/023019
§ 371 (c)(1),
(2) Date: Jun. 26, 2020

(87) PCT Pub. No.: WO2019/177632
PCT Pub. Date: Sep. 19, 2019

(65) Prior Publication Data
US 2021/0066394 A1   Mar. 4, 2021

(51) Int. Cl.
*H01L 27/24* (2006.01)
*H01L 21/768* (2006.01)
*H01L 23/522* (2006.01)

(52) U.S. Cl.
CPC .... *H01L 27/2463* (2013.01); *H01L 21/76802* (2013.01); *H01L 21/76892* (2013.01); *H01L 21/76897* (2013.01); *H01L 23/5226* (2013.01); *H01L 27/2409* (2013.01)

(58) Field of Classification Search
CPC combination set(s) only.
See application file for complete search history.

(56) References Cited

U.S. PATENT DOCUMENTS

| 8,716,773 B2 * | 5/2014 | Taniguchi | H01L 27/10888 257/296 |
| 2001/0017417 A1 * | 8/2001 | Kuroda | H01L 21/28525 257/758 |
| 2002/0030209 A1 * | 3/2002 | Sugiyama | H01L 27/10888 257/296 |
| 2004/0140486 A1 | 7/2004 | Lee et al. | |
| 2005/0037590 A1 * | 2/2005 | Inoue | H01L 27/10814 438/396 |
| 2010/0019304 A1 | 1/2010 | Minami et al. | |
| 2013/0049086 A1 | 2/2013 | Ahn et al. | |
| 2013/0056699 A1 | 3/2013 | Lung et al. | |
| 2014/0070162 A1 * | 3/2014 | Iwayama | G11C 11/1659 257/4 |

(Continued)

OTHER PUBLICATIONS

International Search Report and Written Opinion for PCT Patent Application No. PCT/US18/23019, dated Dec. 5, 2018, 12 pages.

*Primary Examiner* — Mamadou L Diallo
(74) *Attorney, Agent, or Firm* — Compass IP Law PC

(57) ABSTRACT

One embodiment provides a method of making a memory device. The method includes forming a via in a bit line, an interlayer and a dielectric region. The bit line is formed on the interlayer. The interlayer is formed partially on the dielectric region and partially on a plurality of memory cells. The via has a first end included in, and in direct contact with, the bit line and a second end to couple to an electrical contact.

18 Claims, 6 Drawing Sheets

(56) References Cited

U.S. PATENT DOCUMENTS

| | | | |
|---|---|---|---|
| 2014/0071759 A1* | 3/2014 | Nomura | H01L 27/11524 365/185.17 |
| 2015/0263023 A1* | 9/2015 | Toba | H01L 29/40114 257/314 |
| 2016/0233271 A1 | 8/2016 | Pellizzer et al. | |
| 2019/0172502 A1* | 6/2019 | Jeong | H01L 27/2427 |

* cited by examiner

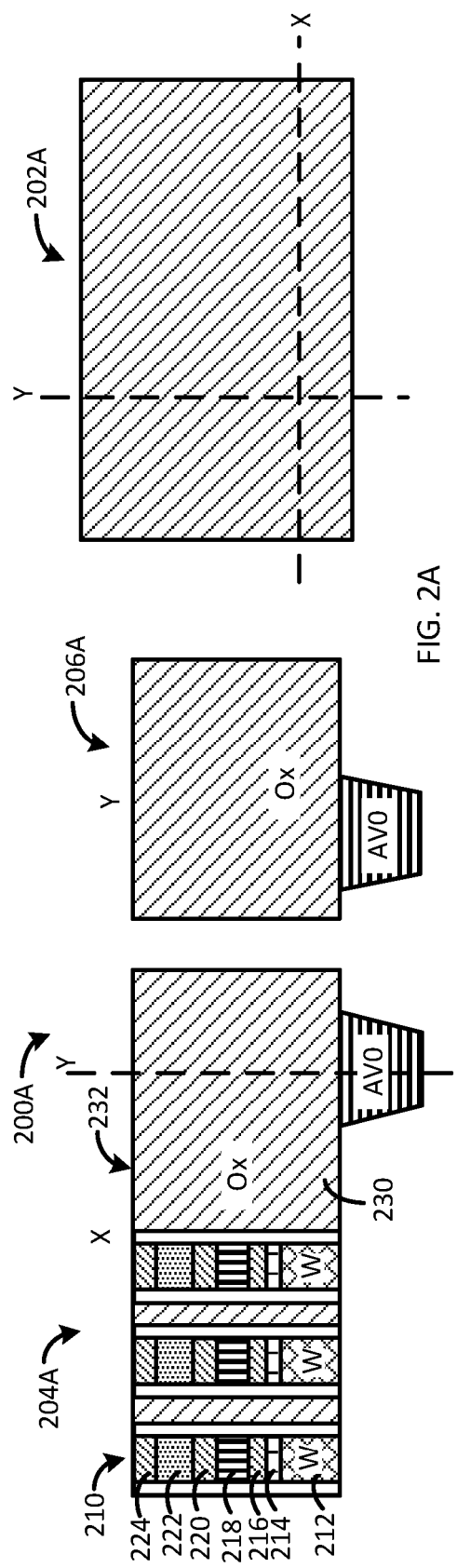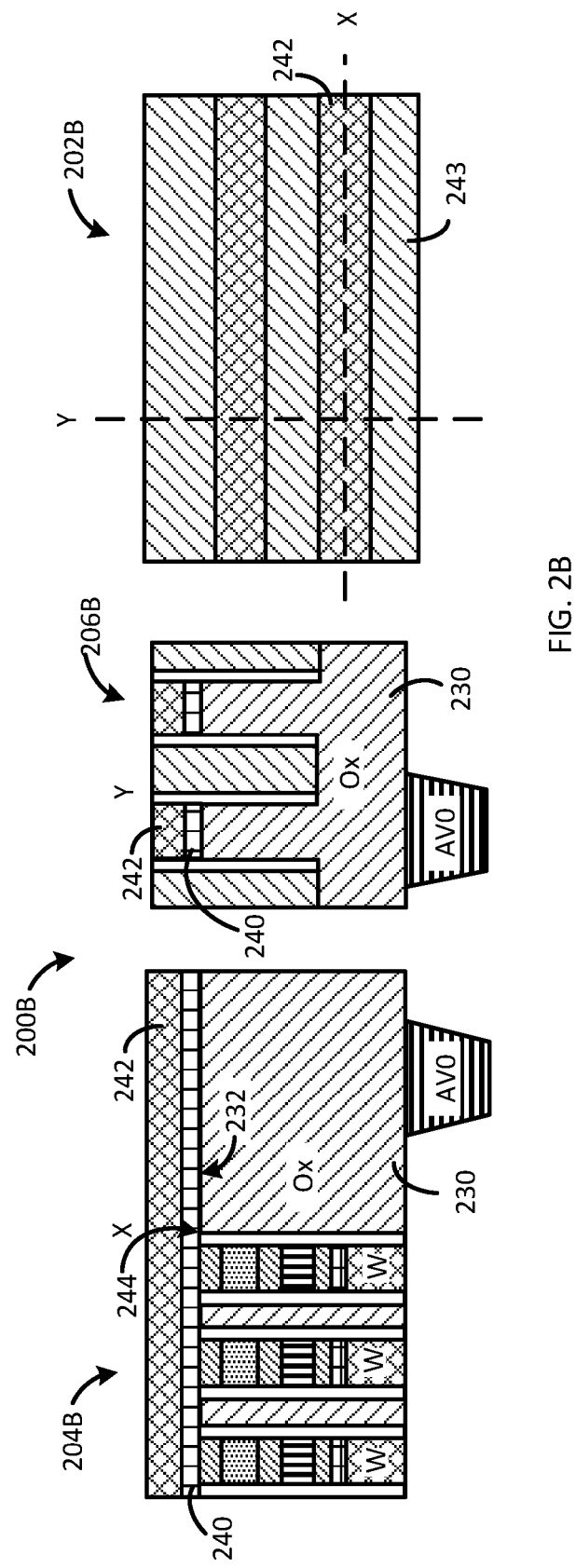
FIG. 2A
FIG. 2B

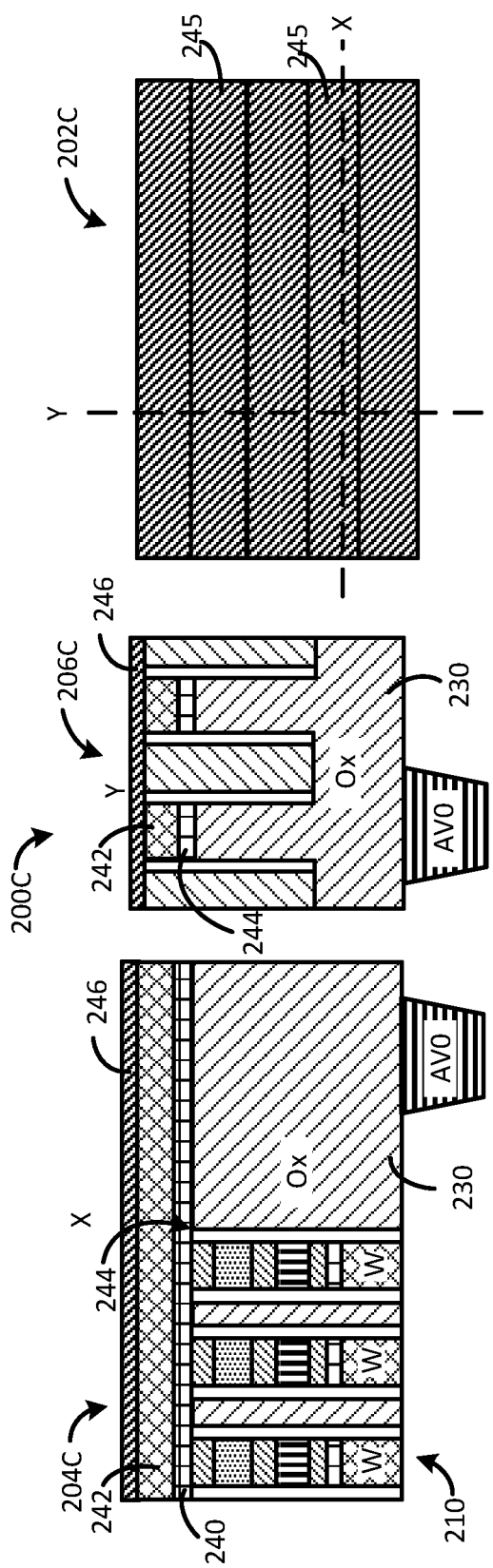
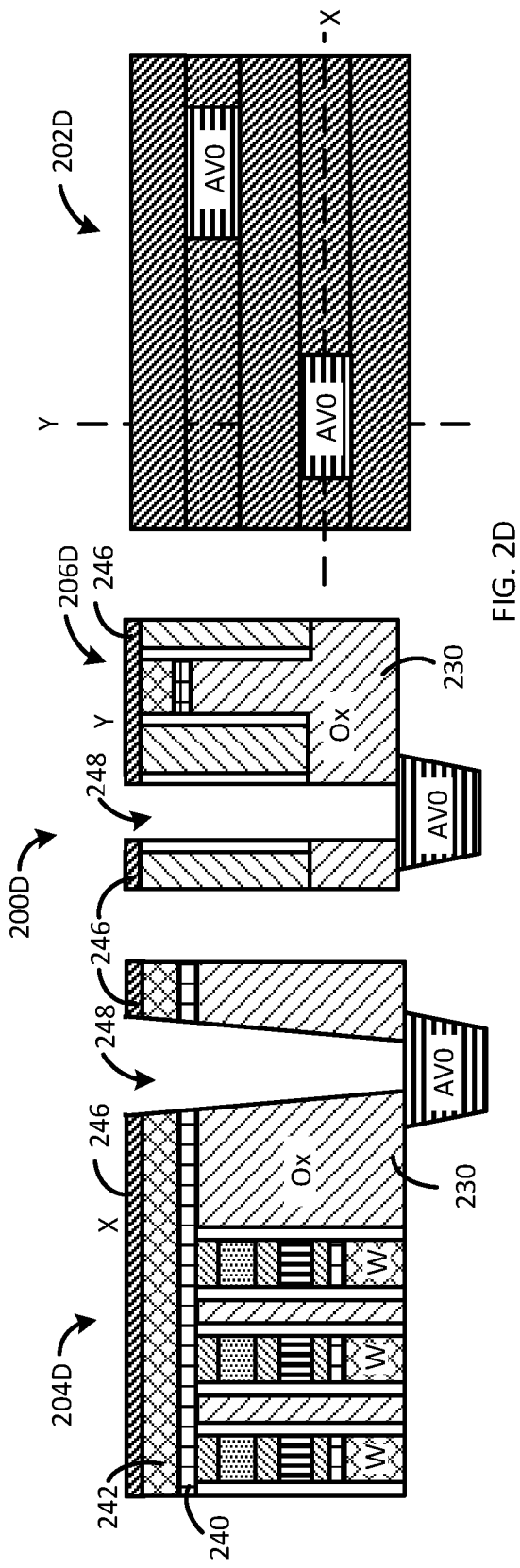
FIG. 2C
FIG. 2D

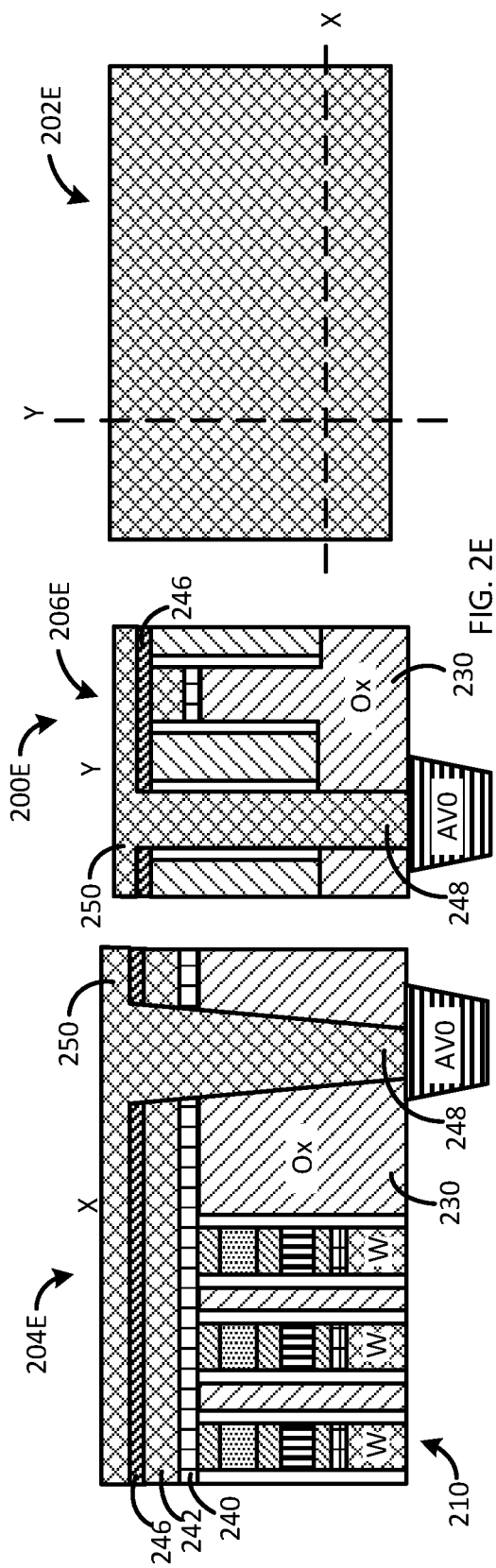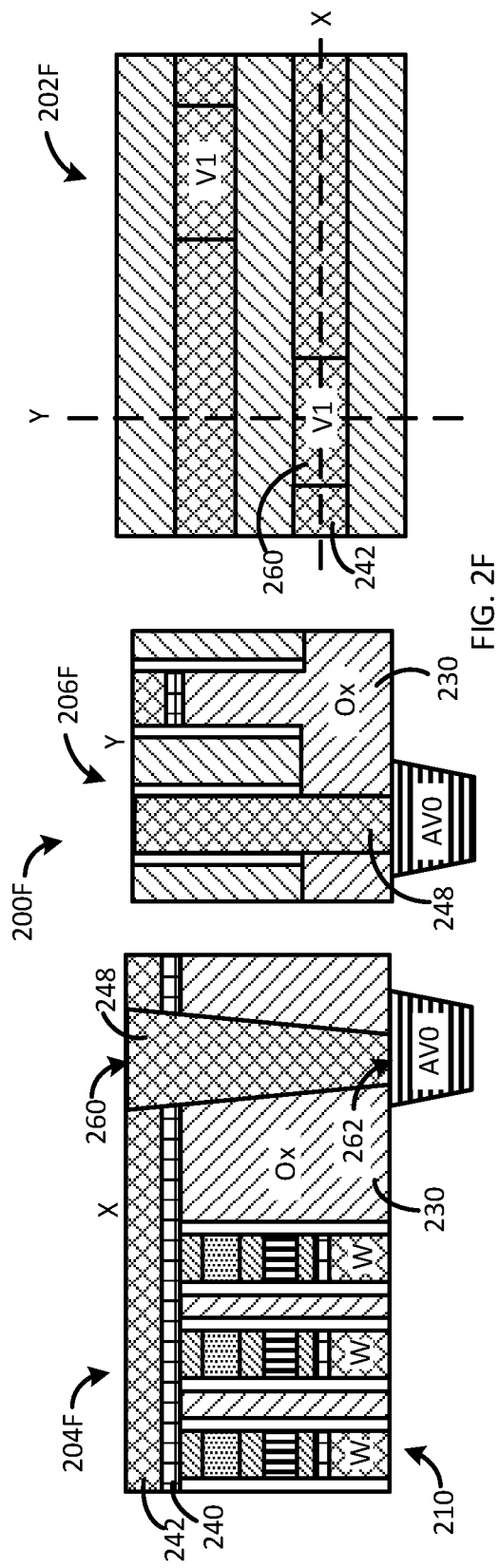
FIG. 2E
FIG. 2F

VIA RESISTANCE REDUCTION

FIELD

The present disclosure relates to resistance reduction, in particular to, via resistance reduction.

BACKGROUND

Phase change memory is a memory device which typically uses a chalcogenide material for the memory elements. In operation, the phase change memory stores information on the memory element by changing the phase of the memory element between amorphous and crystalline phases. Generally, the amorphous phase has a low conductivity and is associated with a reset state and the crystalline phase has a high conductivity and is associated with a set state. Material phase transitions may be induced by electrically heating the phase change materials by applying a current (programming current) that flows through a target memory cell. Joule heating may then induce a phase change transition, from the crystalline state to the amorphous state or from the amorphous state to the crystalline state.

BRIEF DESCRIPTION OF DRAWINGS

Features and advantages of the claimed subject matter will be apparent from the following detailed description of embodiments consistent therewith, which description should be considered with reference to the accompanying drawings, wherein:

FIGS. 2A-2F illustrate stepwise formation of a via according to various embodiments of the present disclosure;

Figure 1:
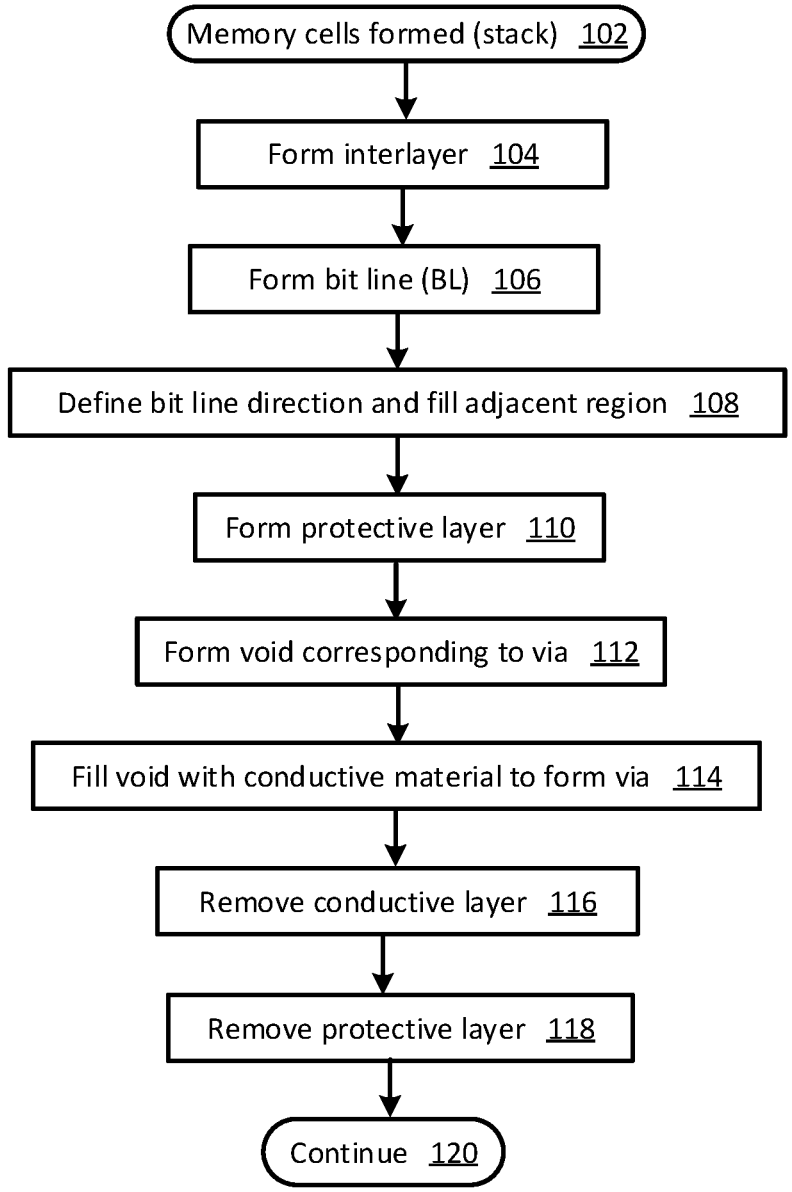
FIG. 1 is a flow diagram of example operations of a method of making a memory device that includes forming a via consistent with several embodiments of the present disclosure.

Although the following Detailed Description will proceed with reference being made to illustrative embodiments, many alternatives, modifications, and variations thereof will be apparent to those skilled in the art.

DETAILED DESCRIPTION

Phase change memory cells may be arranged in a three-dimensional cross-point memory array including a first group of address lines and a second group of address lines. The first group of address lines corresponds to word lines (WLs) and the second group of address lines corresponds to bit lines (BLs). The WLs and BLs cross and each memory cell is coupled between a WL and a BL where the WL and BL cross (i.e., cross-point).

A decoder may be a source of programming current for a memory device. The memory device may include a plurality of memory cells, coupled between respective word lines and bit lines. A path between the decoder and one or more memory cells may include a via between an electrical contact included in a first layer and a bit line included in a second layer. The first layer and the second layer may be separated by at least a dielectric region. The memory cells may be coupled to the bit line by an interlayer constructed of, for example, tungsten silicon nitride (WSiN). The interlayer is configured to enhance operation of the memory cells including, for example, reducing current spikes by increasing resistivity of the memory cell and/or improving thermal characteristics. The interlayer may further reduce a resistivity of an associated bit line by enhancing growth of the bit line (e.g., tungsten material) on the interlayer on the memory cell.

In conventional memory devices, vias may be formed prior to forming the interlayer and the associated bit line. Thus, the interlayer may be positioned between a via and the associated bit line. Resistivity of the interlayer is generally higher than a resistivity of the bit line and higher than a resistivity of the via. The higher resistivity of the interlayer in the path between the decoder and the memory cell may then limit a maximum current that can flow into the memory cell. In other words, the interlayer may lower a capability of driving current into the memory cell. A reduced current capability may then degrade programming operations of associated memory cells.

As memory devices evolve, their physical sizes may be reduced resulting in a reduction in contact pitch, i.e., a distance between adjacent conductors, for example, bit lines. Resistivity of a bit line may increase as contact pitch decreases. A combination of the relatively high resistance of the interlayer and the increased resistivity of the current path associated with a reduced contact pitch may further limit maximum current flow, further degrading programming operations.

Generally, this disclosure relates to via resistance reduction. Via resistance reduction may be achieved by modifying a memory device manufacturing process (i.e., a method of making the memory device) to form the via after forming the interlayer and associated bit line. Thus, a portion of the interlayer, corresponding to the via, may be removed by the process that forms the via. The via may then be included in and directly contact the bit line. In this manner, the interlayer and its beneficial properties may be retained between the memory cells and the bit line and the resistivity associated with the interlayer may be removed from the paths between the decoder and the memory cells.

The disclosed technique for forming a via after forming an interlayer and bit line may be applied in to variety of additional configurations. For example, in an embodiment, forming a via may include opening word lines or other conductive traces instead of or in addition to a bit line formed over the interlayer. In an embodiment, the disclosed technique for forming a via is used on multiple via levels in a via stack (e.g., a stack of 2, 3, or more vias) to improve via conductivity of an entire via stack.

In an embodiment, a method of making a memory device may include forming a via in a bit line, an interlayer and a dielectric region. The bit line may be formed on the interlayer. The interlayer may be formed partially on a dielectric region and partially on a plurality of memory cells. The via has a first end that is included in, and in direct contact with, the bit line. The via has a second end that is configured to couple to an electrical contact, as will be described in more detail below.

In another embodiment, a memory device may include a plurality of memory cells, a dielectric region and an interlayer formed partially on the dielectric region and partially on the plurality of memory cells. The memory device may further include a bit line formed on the interlayer and a via that has a first end included in, and in direct contact with, the bit line and a second end configured to couple to an electrical contact, as will be described in more detail below.

FIG. 1 is a flow diagram 100 of example operations of a method of making a memory device that includes forming a via consistent with several embodiments of the present disclosure. FIGS. 2A-2F illustrate stepwise formation of a via according to various embodiments of the present disclosure. FIG. 1 and FIGS. 2A-2F may be best understood when considered together.

Initially, a plurality of memory cells ("stack") may be formed 102 on a substrate. In one nonlimiting example the substrate may be silicon. FIG. 2A illustrates a memory device portion 200A including a top view 202A, a Y cross-section 206A and an X cross-section 204A that includes a plurality of memory cells, e.g., memory cell 210, and a dielectric region 230. The dielectric region 230 may be formed of an oxide, e.g., silicon dioxide. Memory cell 210 is coupled to a word line 212. Each word line, e.g., word line 212, may be coupled to an electrical contact (not shown) configured to couple the word line to circuitry that may be present below the word line (and memory cell). Circuitry may include, but is not limited to, a switch, a transistor, logic circuitry, digital circuitry, etc.

Memory cell 210 includes a plurality of layers beginning with a bottom layer 214 adjacent the word line 212 and ending with a top layer 224. The top layer 224 is configured to be adjacent an interlayer, as described herein. Beginning with the bottom layer, the bottom layer 214 is tungsten silicon nitride, a next layer 216 is carbon, a next layer 218 is a switching material, a next layer 220 is carbon, a next layer 222 is a phase change material that is the memory storage element and the top layer 224 is carbon. It should be noted that the memory cells, e.g., memory cell 210, may include fewer or more layers than are shown in FIGS. 2A through 2F and FIG. 3. For example, a first tungsten layer may be included between layers 220 and 222 and/or a second tungsten layer may be included between layers 222 and 224, i.e., between a respective carbon layer 220 or 224 and the phase change material layer 222.

The X cross-section 204A further includes an electrical contact AV0 positioned adjacent the dielectric region 230.

The memory device portion 200A illustrates an intermediate state of the memory device portion during a manufacturing process (i.e., making) of a memory device. The intermediate state of FIG. 2A is prior to formation of the bit lines. In other words, the word lines and the memory cells have been formed but corresponding bit lines have not yet been formed. In a conventional process, a via would be formed between electrical contact AV0 and a top surface 232 of the dielectric region 230 in a next operation prior to forming the bit lines.

In an embodiment consistent with the present disclosure, an interlayer may be formed at operation 104. A bit line may then be formed on the interlayer at operation 106. FIG. 2B illustrates a memory device portion 200B including a top view 202B, a Y cross-section 206B and an X cross-section 204B. Memory device portion 200B corresponds to memory device portion 200A of FIG. 2A following formation of an interlayer 240 and a bit line 242. The interlayer 240 is formed on a top surface 244 of the memory device portion 200B. Top surface 244 includes the top surface 232 of the dielectric region 230. The interlayer 240 may be formed on at least some of the plurality of memory cells and the dielectric region 230. In one nonlimiting example, the interlayer 240 and bit line 242 may be deposited using physical vapor deposition. In one nonlimiting example, the interlayer may be formed of tungsten silicon nitride. In one nonlimiting example, the bit line may be formed of tungsten.

A bit line direction may be defined and an adjacent region filled with fill material at operation 108. Top view 202B of FIG. 2B illustrates a top view of bit line 242 and fill region 243. Fill material may include one or more of silicon mononitride (SiN), silicon oxynitride (SiON) and/or silicon dioxide (SiO2). In one nonlimiting example, the bit line 242 may be defined by an etch process. The fill region 243 may be filled using a physical vapor deposition process, a chemical vapor deposition process and/or a spin on dielectric process.

A protective layer may be formed at operation 110. FIG. 2C illustrates the memory device portion 200C including a top view 202C, a Y cross-section 206C and an X cross-section 204C. Memory device portion 200C corresponds to memory device portion 200B of FIG. 2B following formation of the protective layer 246. The protective layer 246 is formed on a top surface of memory device portion 200C that includes bit line 242. The protective layer portion 245 that is formed on a bit line, e.g., bit line 242, is illustrated in top view 202C. For example, the protective layer 246 may be a nitride deposited by a physical vapor deposition process or a chemical vapor deposition process. Nitride may include, but is not limited to, ammonia (NH3), silane (SiH4), etc. The protective layer 246 may correspond to a stopping layer. The protective layer 246 is configured to facilitate forming a via while avoiding damage to one or more lower layers. Lower layers include, for example, the bit line 242 and the interlayer 240.

A void corresponding to the via may be formed at operation 112. For example, a mask may be applied that exposes a via. A portion of the bit line and a portion of the interlayer may then be selectively removed. A portion of the dielectric region corresponding to the via may then be selectively removed to reach electrical contact AV0.

FIG. 2D illustrates a memory device portion 200D including a top view 202D, a Y cross-section 206D and an X cross-section 204D. Memory device portion 200D corresponds to memory device portion 200C of FIG. 2C following forming a void corresponding to a via. A portion of the bit line 242 and a portion of the interlayer 240 may be removed by selectively dry etching the portion of the bit line 242 and the portion of interlayer 240 corresponding to a cross-section of the via at or near a first end. The portion of the dielectric region may be removed using an oxide etch to reach contact AV0. For example, a dry etchant may include Argon and an oxide etchant may include hydrofluoric acid. The oxide etchant may further include a buffering agent such as ammonium fluoride (NH4F).

A void 248 corresponding to the via extends from a top surface of the protective layer 246 to the electrical contact AV0. A second end of the void corresponding to a second end of the via may then be positioned at the electrical contact AV0. Thus, the void 248 extends through the dielectric region 230, the interlayer 240, the bit line 242 and the protective layer 246.

The void may be filled with a conductive material to form a via at operation 114. FIG. 2E illustrates a memory device portion 200E including a top view 202E, a Y cross-section 206E and an X cross-section 204E. Memory device portion 200E corresponds to memory device portion 200D of FIG. 2D following filling the void with conductive material to form the via. For example, the via may be filled with tungsten using physical vapor deposition. The fill of via 248 is configured to directly contact electrical contact AV0. Filling the void to form the via 248 includes forming a conductive layer 250 of conductive material on the protective layer 246. Thus, the conductive material of the via 248 extends from the electrical contact AV0, through the dielectric region 230, the interlayer 240, the bit line 242 and the protective layer 246.

The conductive layer 250 may be removed at operation 116. The protective layer 246 is configured to act as a stopping layer during removal of the conductive layer 250. The protective layer may be removed at operation 118. FIG. 2F illustrates a memory device portion 200F including a top view 202F, a Y cross-section 206F and an X cross-section 204F. Memory device portion 200F corresponds to memory device portion 200E of FIG. 2E following removal of the conductive layer and removal of the protective layer. In one nonlimiting example, the conductive layer 250 may be removed, e.g., planarized, using a chemical mechanical polishing technique. In one nonlimiting example, the protective layer may be removed using a dry etch technique. As a result, the conductive layer 250 above the top surface of the bit line 242 has been removed as well as the protective layer 246. The via 248 extends from the electrical contact AV0, through a void defined in the interlayer 240 into the bit line 242 to a top surface 262 of the bit line 242. Thus, a top surface 260 of the via 248 corresponds to the top surface 262 of the bit line 242.

The method of making the memory device may then continue at operation 120. For example, a second bit line may be formed on bit line 242, as described herein.

Thus, a via may be formed that directly contacts a bit line while maintaining an interlayer positioned between the bit line and one or more memory cells.

The disclosed techniques of forming the via 248 after forming the interlayer 240 and the bit line 242 may be applied to variety of additional configurations. In one embodiment, forming the via 248 may include opening (e.g., etching) a word line or other conductive trace instead of or in addition to the bit line 242. In one embodiment, the disclosed technique for forming the via 248 may be used to form the via AV0 in addition to forming the via 248. In one embodiment, the disclosed technique for forming the via 248 may be is used on multiple via levels in a via stack (e.g., a stack of 2, 3, or more vias) to improve via conductivity.

Figure 3:
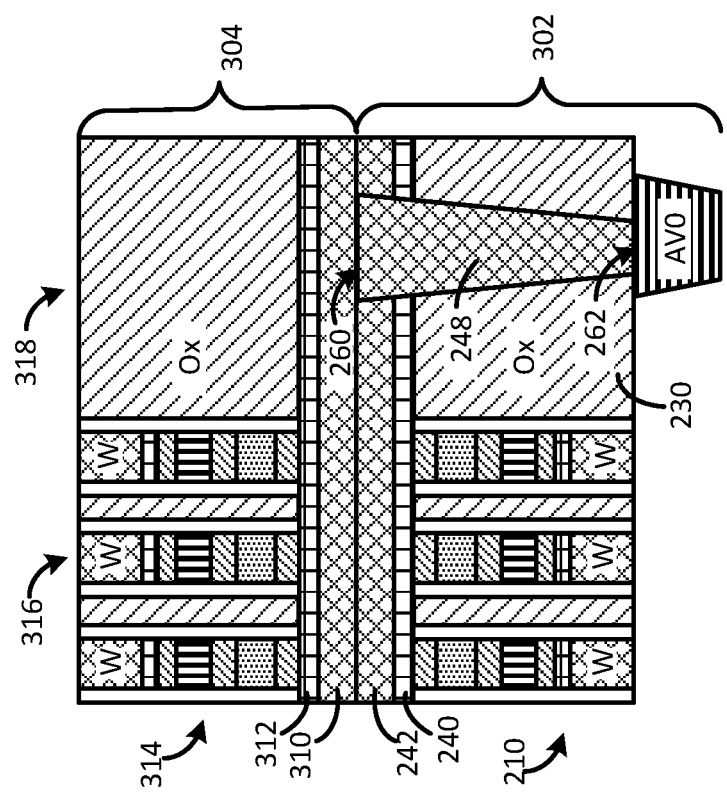
FIG. 3 illustrates two decks including a via formed according to the operations of FIG. 1.

FIG. 3 illustrates two decks 302, 304 including a via according to various embodiments of the present disclosure. A first deck 302 is one example of a memory device portion made according to the process illustrated in FIG. 1. Thus, the first deck 302 corresponds to memory device portion 204F of FIG. 2F. A second deck 304 may be formed on top of the first deck 302. For example, a second bit line 310 may be formed on bit line ("first bit line") 242. The second bit line 310 may thus contact the first bit line 242 and a first end 260 of via 248. Similar to the first deck 302, the second deck 304 includes an interlayer 312, a plurality of memory cells 314, a plurality of word lines 316 and a dielectric portion 318.

Thus, generally, this disclosure relates to via resistance reduction. Via resistance reduction may be achieved by modifying a method of making the memory device to form the via after depositing the interlayer and associated bit line. Thus, a portion of the interlayer, corresponding to the via, may be removed by the process that forms the via. The via may then be included in and directly contact the bit line. In this manner, the interlayer and its beneficial properties may be retained between the memory cells and the bit line and the resistivity associated with the interlayer may be removed from the paths between the decoder and the memory cells. Additional advantages of the disclosed technique for forming a via may include, but are not limited to, cost reduction (e.g., by reducing eliminating a tungsten/metal layer buff chemical mechanical planarization (CMP) step and/or by eliminating an oxide CMP step), reduced socket dishing, reduced via protrusions, reduced bit line and/or word line destruction, reduced contamination caused by alignment mark damage, and/or reduction in under-etch issues associated with CMP oxide layers.

Embodiments of the disclosed via resistance reduction techniques for manufacturing vias may be applied to a variety of memory devices. Examples of memory devices having vias that may be manufactured according to the techniques illustrated in FIGS. 1-3 and described above include, but are not limited to, a NAND flash memory (e.g., Single-Level Cell ("SLC"), Multi-Level Cell ("MLC"), Tri-Level Cell ("TLC"), Quad-Level Cell ("QLC"), or some other NAND flash memory type), NOR memory, solid-state memory (e.g., planar or three-dimensional ("3D") NAND flash memory or NOR flash memory), storage devices that use chalcogenide phase change material (e.g., chalcogenide glass), byte addressable non-volatile memory devices, ferroelectric memory, silicon-oxide-nitride-oxide-silicon ("SONOS") memory, polymer memory (e.g., ferroelectric polymer memory), byte addressable random accessible 3D XPoint™ memory, ferroelectric transistor random access memory ("Fe-TRAM"), magnetoresistive random access memory ("MRAM"), phase change memory ("PCM", "PRAM"), resistive memory, ferroelectric memory ("F-RAM", "FeRAM"), spin-transfer torque memory ("STT"), thermal assisted switching memory ("TAS"), millipede memory, floating junction gate memory ("FJG RAM"), magnetic tunnel junction ("MTJ") memory, electrochemical cells ("ECM") memory, binary oxide filament cell memory, interfacial switching memory, battery-backed RAM, ovonic memory, nanowire memory, electrically erasable programmable read-only memory ("EEPROM)", and/or random access memories (RAMs) such as dynamic and static RAMs.

Figure 4:
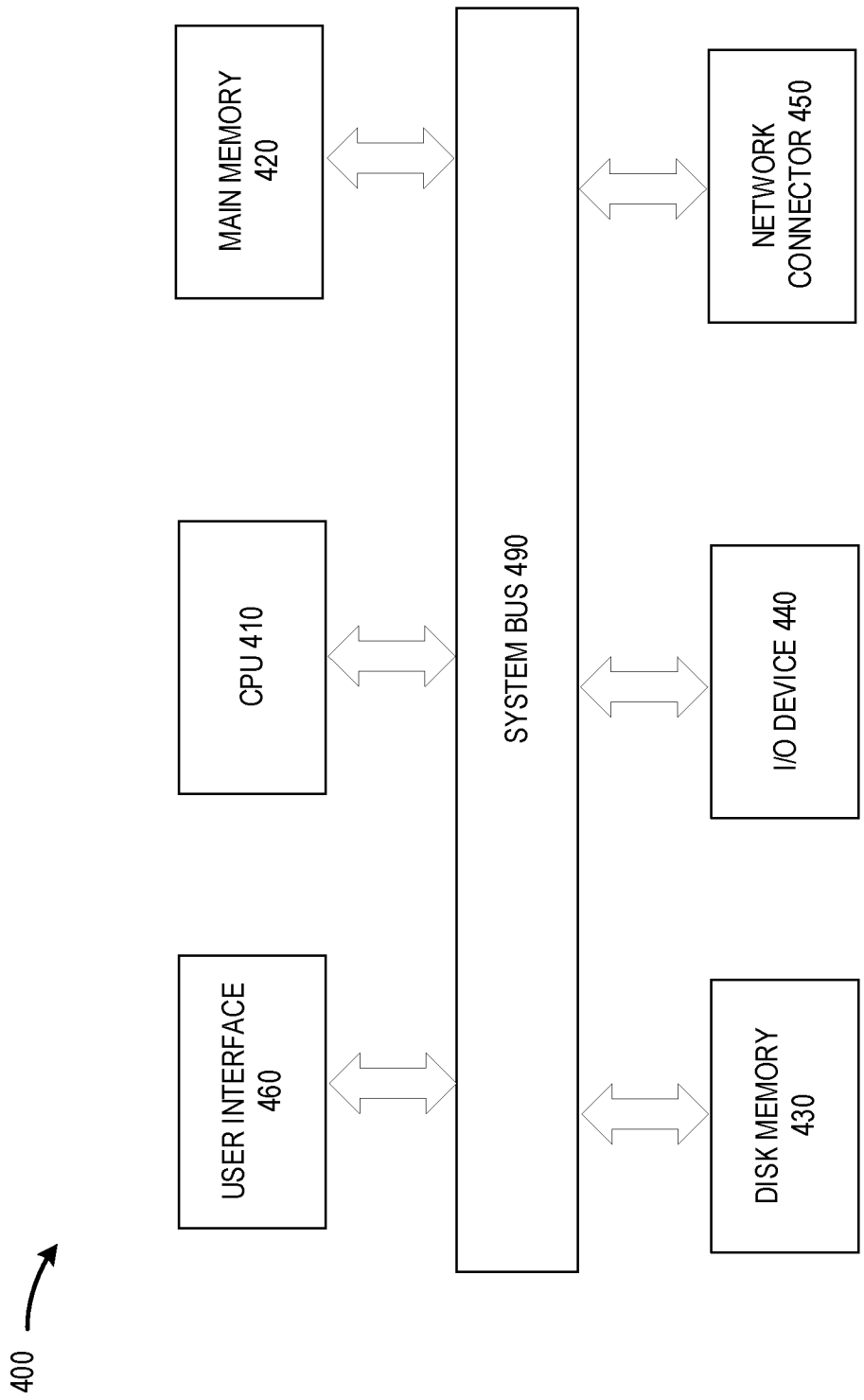
FIG. 4 illustrates a diagram of a system that includes vias consistent with several embodiments of the present disclosure.

FIG. 4 is an illustrative diagram of a computing system 400 that may use one or more of the disclosed techniques for via resistance reduction, consistent with embodiments of the present disclosure. The computing system 400 may be included in, for example, a desktop computer, a laptop computer, a netbook, a notebook computer, a personal digital assistant (PDA), a server, a workstation, a cellular telephone, a mobile computing device, an Internet appliance or any other type of computing device.

The computing system 400 may include central processing unit (CPU) 410 to exchange data, via system bus 490, with user interface 460, main memory 420, disk memory 430, I/O device 440 and network connector 450.

The main memory 420 may include, for example, synchronous dynamic random-access memory (SDRAM), dynamic random access memory (DRAM), RAMBUS dynamic random access memory (RDRAM), any other type of random access memory device, non-volatile memory (e.g., solid state memory, phase change memory, 3D XPoint™), and/or any combination thereof.

The disk memory 430 may be integrated with the main memory 420, or may be included in a separate device. The disk memory 430 may comprise, for example, a solid state disk (SSD) drive, flash memory, phase change memory (PCM), read-only memory (ROM), electrically erasable programmable read-only memory (EEPROM), or any other type of non-volatile memory device.

One or more of the main memory 420 or the disk memory 430 can be fabricated using one or more of the via resistance reduction techniques disclosed herein, consistent with the present disclosure.

The network connector 450 may comprise, for example, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any other form of wireless communication protocol.

As used in any embodiment herein, the term "logic" may refer to an app, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry," as used in any embodiment herein, may comprise, for example, singly or in any combination, hard-wired circuitry, programmable circuitry, state machine circuitry, logic and/or firmware that stores instructions executed by programmable circuitry. The circuitry may be embodied as an integrated circuit, such as an integrated circuit chip. In some embodiments, the circuitry may be formed, at least in part, by the CPU 410 executing code and/or instructions sets (e.g., software, firmware, etc.) corresponding to the functionality described herein, thus transforming a general-purpose processor into a specific-purpose processing environment to perform one or more of the operations described herein. In some embodiments, the various components and circuitry of the memory controller circuitry or other systems may be combined in a system-on-a-chip (SoC) architecture.

Embodiments of the operations described herein may be implemented in a computer-readable storage device (or storage medium) having stored thereon instructions that when executed by one or more processors perform the methods. The processor may include, for example, a processing unit and/or programmable circuitry. The storage device may include a machine readable storage device including any type of tangible, non-transitory storage device, for example, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of storage devices suitable for storing electronic instructions.

In some embodiments, a hardware description language (HDL) may be used to specify circuit and/or logic implementation(s) for the various logic and/or circuitry described herein. For example, in one embodiment the hardware description language may comply or be compatible with a very high speed integrated circuits (VHSIC) hardware description language (VHDL) that may enable semiconductor fabrication of one or more circuits and/or logic described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

EXAMPLES

Examples of the present disclosure include subject material such as a method, a device, or of an apparatus or system related to via resistance reduction, as discussed below.

Example 1

According to this example, there is provided a method of making a memory device. The method includes forming a via in a bit line, an interlayer and a dielectric region. The bit line is formed on the interlayer. The interlayer is formed partially on the dielectric region and partially on a plurality of memory cells. The via has a first end included in, and in direct contact with, the bit line and a second end to couple to an electrical contact.

Example 2

This example includes the elements of example 1, wherein the forming the via comprises depositing a protective layer on the bit line and forming a void, corresponding to the via, in the bit line, the interlayer and the dielectric region.

Example 3

This example includes the elements of example 2, further comprising filling the void with a conductive material, the filling forming a conductive layer of conductive material on the protective layer.

Example 4

This example includes the elements of example 3, further comprising removing the conductive layer to the protective layer after filling the void with the conductive material.

Example 5

This example includes the elements of example 4, further comprising removing the protective layer after removing the conductive layer.

Example 6

This example includes the elements of example 2, wherein forming the void comprises etching to selectively remove a portion of the bit line, a portion of the interlayer and a portion of the dielectric region, the portions corresponding to the via.

Example 7

This example includes the elements of example 1 or 2, wherein the via and the bit line are self-aligned.

Example 8

This example includes the elements of example 1 or 2, wherein the interlayer is to enhance operation of the plurality of memory cells.

Example 9

This example includes the elements of example 1 or 2, wherein the plurality of memory cells are phase change memory cells.

Example 10

This example includes the elements of example 1 or 2, wherein the interlayer is to lower a resistivity of the bit line.

Example 11

This example includes the elements of example 2, wherein the protective layer is to facilitate forming the via while avoiding damage to one or more lower layers.

Example 12

This example includes the elements of example 2, wherein the protective layer corresponds to a stopping layer.

Example 13

This example includes the elements of example 1 or 2, wherein the via comprises tungsten, the bit line comprises tungsten and the interlayer comprises tungsten, silicon and a nitride.

Example 14

This example includes the elements of example 1 or 2, wherein the bit line and the interlayer are formed using physical vapor deposition.

Example 15

This example includes the elements of example 1 or 2, wherein the plurality of memory cells are three-dimensional cross-point memory cells.

Example 16

This example includes the elements of example 2, wherein the protective layer comprises a nitride.

Example 17

This example includes the elements of example 3, wherein filling the void is performed using a physical vapor deposition technique.

Example 18

This example includes the elements of example 4, wherein the conductive layer is removed using a chemical mechanical polish technique.

Example 19

This example includes the elements of example 5, wherein the protective layer is removed using a dry etch technique.

Example 20

This example includes the elements of example 6, wherein the etching comprises metal etching followed by dielectric etching.

Example 21

According to this example, there is provided a memory device. The memory device includes a plurality of memory cells; a dielectric region; an interlayer formed partially on the dielectric region and partially on the plurality of memory cells; a bit line formed on the interlayer; and a via. The via has a first end included in, and in direct contact with, the bit line and a second end to couple to an electrical contact.

Example 22

This example includes the elements of example 21, wherein the via and the bit line are self-aligned.

Example 23

This example includes the elements of example 21, wherein the interlayer is to enhance operation of the plurality of memory cells.

Example 24

This example includes the elements of example 21, wherein the interlayer is to lower a resistivity of the bit line.

Example 25

This example includes the elements according to any one of examples 21 to 24, wherein the via comprises tungsten, the bit line comprises tungsten and the interlayer comprises tungsten silicon nitride.

Example 26

This example includes the elements according to any one of examples 21 to 24, wherein the plurality of memory cells are phase change memory cells.

Example 27

This example includes the elements according to any one of examples 21 to 24, wherein the plurality of memory cells are three-dimensional cross-point memory cells.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A method of making a memory device, the method comprising:

forming a via in a bit line, an interlayer and a dielectric region, the bit line formed on the interlayer, the interlayer formed partially on the dielectric region and partially on a plurality of memory cells, the via having a first end included in, and in direct contact with, the bit line and a second end to couple to an electrical contact.

2. The method of claim 1, wherein the forming the via comprises depositing a protective layer on the bit line and forming a void, corresponding to the via, in the bit line, the interlayer and the dielectric region.

3. The method of claim 2, further comprising filling the void with a conductive material, the filling forming a conductive layer of conductive material on the protective layer.

4. The method of claim 3, further comprising removing the conductive layer to the protective layer after filling the void with the conductive material.

5. The method of claim 4, further comprising removing the protective layer after removing the conductive layer.

6. The method of claim 2, wherein forming the void comprises etching to selectively remove a portion of the bit line, a portion of the interlayer and a portion of the dielectric region, the portions corresponding to the via.

7. The method of claim 1, wherein the via and the bit line are self-aligned.

8. The method of claim 1, wherein the interlayer is to enhance operation of the plurality of memory cells.

9. The method of claim 1, wherein the plurality of memory cells are phase change memory cells.

10. The method of claim 1, wherein the interlayer is to lower a resistivity of the bit line.

11. The method of claim 2, wherein the protective layer is to facilitate forming the via while avoiding damage to one or more lower layers.

12. The method of claim 2, wherein the protective layer corresponds to a stopping layer.

13. A memory device comprising:

a plurality of memory cells;

a dielectric region;

an interlayer formed partially on the dielectric region and partially on the plurality of memory cells;

a bit line formed on the interlayer; and a via having a first end included in, and in direct contact with, the bit line and a second end to couple to an electrical contact.

14. The memory device of claim 13, wherein the via and the bit line are self-aligned.

15. The memory device of claim 13, wherein the interlayer is to enhance operation of the plurality of memory cells.

16. The memory device of claim 13, wherein the interlayer is to lower a resistivity of the bit line.

17. The memory device of claim 13, wherein the via comprises tungsten, the bit line comprises tungsten and the interlayer comprises tungsten silicon nitride.

18. The memory device of claim 13, wherein the plurality of memory cells are phase change memory cells.

* * * * *